US012604462B2

(12) United States Patent
Shih et al.

(10) Patent No.: US 12,604,462 B2
(45) Date of Patent: Apr. 14, 2026

(54) SEMICONDUCTOR STRUCTURE HAVING WORD LINE AND MANUFACTURING METHOD THEREOF

(71) Applicant: NANYA TECHNOLOGY CORPORATION, New Taipei City (TW)

(72) Inventors: Chiang-Lin Shih, New Taipei City (TW); Yu-Ting Lin, New Taipei City (TW)

(73) Assignee: NANYA TECHNOLOGY CORPORATION, New Taipei City (TW)

( * ) Notice: Subject to any disclaimer, the term of this patent is extended or adjusted under 35 U.S.C. 154(b) by 607 days.

(21) Appl. No.: 17/822,126

(22) Filed: Aug. 24, 2022

(65) Prior Publication Data

US 2024/0074152 A1     Feb. 29, 2024

(51) Int. Cl.
*H10B 12/00*          (2023.01)

(52) U.S. Cl.
CPC ............. *H10B 12/34* (2023.02); *H10B 12/03* (2023.02); *H10B 12/053* (2023.02); *H10B 12/488* (2023.02)

(58) Field of Classification Search
CPC ...... H10B 12/488; H10B 12/03; H10B 12/34; H10B 12/036; H10B 12/33; H10B 12/05
See application file for complete search history.

(56) References Cited

U.S. PATENT DOCUMENTS

| | | | | |
|---|---|---|---|---|
| 6,211,036 | B1 * | 4/2001 | Morimoto .............. | H10D 1/714 |
| | | | | 438/254 |
| 10,622,030 | B1 * | 4/2020 | Wang ................... | H10B 12/488 |
| 2002/0071304 | A1 * | 6/2002 | Kang .................... | H10B 53/30 |
| | | | | 257/E21.664 |
| 2008/0061342 | A1 * | 3/2008 | Lee ...................... | H10B 12/482 |
| | | | | 257/303 |
| 2009/0026516 | A1 * | 1/2009 | Cheng ................ | H10B 12/0385 |
| | | | | 257/E21.651 |
| 2014/0346583 | A1 * | 11/2014 | Purayath ............. | H10D 64/035 |
| | | | | 438/586 |
| 2016/0118304 | A1 * | 4/2016 | Zang ................... | H10D 84/0167 |
| | | | | 438/694 |
| 2020/0013791 | A1 * | 1/2020 | Or-Bach ............. | G11C 11/5628 |
| 2021/0134805 | A1 * | 5/2021 | Chang ................. | G11C 11/4023 |
| 2023/0019891 | A1 * | 1/2023 | Xiao ................... | H10D 30/6728 |
| 2023/0069096 | A1 * | 3/2023 | Yang ..................... | H01L 25/18 |

* cited by examiner

*Primary Examiner* — William B Partridge
*Assistant Examiner* — Felix B Andrews
(74) *Attorney, Agent, or Firm* — CKC & Partners Co., LLC

(57)          ABSTRACT

A semiconductor structure includes a first dielectric layer, a second dielectric layer on the first dielectric layer, a capacitor structure in the first dielectric layer and the second dielectric layer, a third dielectric layer on the second dielectric layer, a word line, a channel structure, and a gate dielectric. The word line is located in the third dielectric layer and extends across the capacitor structure. The channel structure is located in the third dielectric layer and surrounds the word line and a portion of the third dielectric layer. The gate dielectric has a first portion and a second portion separated from the first portion, wherein the first portion is between a sidewall of the word line and the channel structure, and the second portion is between an inner sidewall of the third dielectric layer and the channel structure.

19 Claims, 14 Drawing Sheets

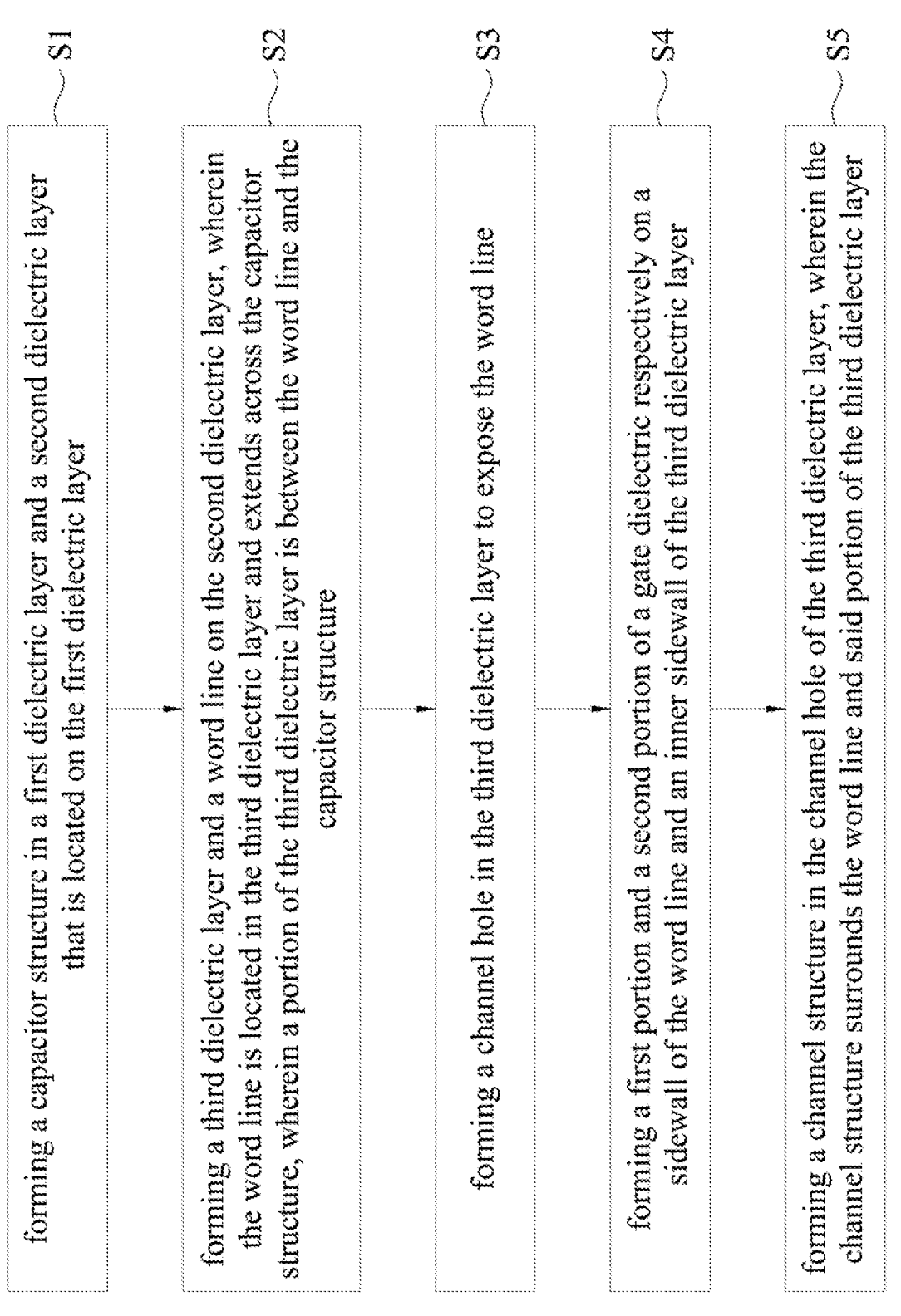

forming a capacitor structure in a first dielectric layer and a second dielectric layer that is located on the first dielectric layer ⟶ S1 forming a third dielectric layer and a word line on the second dielectric layer, wherein the word line is located in the third dielectric layer and extends across the capacitor structure, wherein a portion of the third dielectric layer is between the word line and the capacitor structure ⟶ S2 forming a channel hole in the third dielectric layer to expose the word line ⟶ S3 forming a first portion and a second portion of a gate dielectric respectively on a sidewall of the word line and an inner sidewall of the third dielectric layer ⟶ S4 forming a channel structure in the channel hole of the third dielectric layer, wherein the channel structure surrounds the word line and said portion of the third dielectric layer ⟶ S5

SEMICONDUCTOR STRUCTURE HAVING WORD LINE AND MANUFACTURING METHOD THEREOF

BACKGROUND

Field of Invention

The present disclosure relates to a semiconductor structure and a manufacturing method of the semiconductor structure.

Description of Related Art

A conventional DRAM cell includes a transistor and a capacitor coupled to the transistor. As DRAM density increases, the channel length of conventional planar transistors decreases, resulting in short channel effects, including drain-induced barrier lowering (DIBL) and the like. Shrinking device dimensions reduce the distance between word lines and bit lines, and ultimately cause higher parasitic capacitances between the word lines and bit lines. A buried word line (buried-WL) DRAM structure in which the word lines are buried in the substrate is one of the solutions to this problem. However, when the structure is further reduced, the etch depth of the shallow trench isolation (STI) will vary greatly, and eventually word line interference will be caused after the buried word lines are formed.

Additionally, in a memory vertical transistor with a GAA (gate all-around) design, the gate metal (i.e., the word line) of the transistor needs to completely surround the channel region of the transistor. However, a predetermined space between the gate metal and the channel region is too small (e.g., 5 nm). Therefore, CD (Critical dimension) vibration and OVL (Overlay) shift during manufacturing processes may lead the word line to expose a portion of the channel region, which results in poor capability of gate control.

SUMMARY

One aspect of the present disclosure provides a semiconductor structure.

According to some embodiments of the present disclosure, a semiconductor structure includes a first dielectric layer, a second dielectric layer, a capacitor structure, a third dielectric layer, a word line, a channel structure, and a gate dielectric. The second dielectric layer is located on the first dielectric layer. The capacitor structure is located in the first dielectric layer and the second dielectric layer. The third dielectric layer is located on the second dielectric layer. The word line is located in the third dielectric layer and extends across the capacitor structure, wherein a portion of the third dielectric layer is between the word line and the capacitor structure. The channel structure is located in the third dielectric layer and surrounds the word line and said portion of the third dielectric layer. The gate dielectric has a first portion and a second portion separated from the first portion, wherein the first portion is between a sidewall of the word line and the channel structure, and the second portion is between an inner sidewall of the third dielectric layer and the channel structure.

In some embodiments, a width of a bottom of the word line is greater than a width of a top of the word line.

In some embodiments, the top of the word line is in contact with the channel structure.

In some embodiments, the first portion of the gate dielectric extends to a sidewall of said portion of the third dielectric layer.

In some embodiments, the semiconductor structure further includes a source region between a top of the capacitor structure and a bottom of said portion of the third dielectric layer.

In some embodiments, a bottom of the first portion of the gate dielectric is in contact with the source region.

In some embodiments, a bottom of the second portion of the gate dielectric is in contact with the source region.

In some embodiments, a bottom of the channel structure is in contact with the source region.

In some embodiments, the channel structure is surrounded by the second portion of the gate dielectric.

In some embodiments, the semiconductor structure further includes a drain region located on a top of the channel structure.

In some embodiments, the semiconductor structure further includes a bit line electrically connected to the drain region.

In some embodiments, the semiconductor structure further includes a landing pad between the drain region and the bit line.

In some embodiments, the semiconductor structure further includes a fourth dielectric layer and a fifth dielectric layer. The fourth dielectric layer is located on the bit line. The fifth dielectric layer is located on the fourth dielectric layer, wherein a material of the fifth dielectric layer is different from a material of the fourth dielectric layer.

In some embodiments, the capacitor structure includes a semiconductor material, a first electrode, a high-k dielectric, and a second electrode. The first electrode surrounds the semiconductor material. The high-k dielectric surrounds the first electrode. The second electrode surrounds a bottom portion of the high-k dielectric.

Another aspect of the present disclosure provides a manufacturing method of a semiconductor structure.

According to some embodiments of the present disclosure, a manufacturing method of a semiconductor structure includes forming a capacitor structure in a first dielectric layer and a second dielectric layer that is located on the first dielectric layer; forming a third dielectric layer and a word line on the second dielectric layer, wherein the word line is located in the third dielectric layer and extends across the capacitor structure, wherein a portion of the third dielectric layer is between the word line and the capacitor structure; forming a channel hole in the third dielectric layer to expose the word line; forming a first portion and a second portion of a gate dielectric respectively on a sidewall of the word line and an inner sidewall of the third dielectric layer; and forming a channel structure in the channel hole of the third dielectric layer, wherein the channel structure surrounds the word line and said portion of the third dielectric layer.

In some embodiments, forming the third dielectric layer and the word line on the second dielectric layer is performed such that a width of a bottom of the word line is greater than a width of a top of the word line.

In some embodiments, forming the first portion and the second portion of the gate dielectric is performed such that the first portion of the gate dielectric extends to a sidewall of said portion of the third dielectric layer.

In some embodiments, forming the channel hole in the third dielectric layer comprises etching the third dielectric layer by using an enchant having a high etch selectivity between the third dielectric layer and the word line.

In some embodiments, forming the third dielectric layer and the word line on the second dielectric layer is performed such that the word line has a width in a range from 10 nm to 12 nm.

In some embodiments, forming the channel hole in the third dielectric layer is performed such that the channel hole has a diameter is in a range from 40 nm to 44 nm.

In the aforementioned embodiments of the present disclosure, since a portion of the third dielectric layer is between the word line and the capacitor structure, and the channel structure surrounding the word line and said portion of the third dielectric layer can act as a channel of a transistor, gate control of the semiconductor structure can be achieved by outer sidewalls of the word line. As a result of such a configuration, the semiconductor structure having the word line and the channel structure can overcome the problems of CD (Critical dimension) vibration and OVL (Overlay) shift about a traditional design associated with a word line surrounding and a channel, thereby improving capability of gate control.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3 is a flow chart of a manufacturing method of a semiconductor structure according to some embodiments of the present disclosure.

FIGS. 5, 7, 9, 11, and 13 are cross-sectional views at intermediate stages of the manufacturing method of the semiconductor structure, in which FIG. 5 is a cross-sectional view taken along line 5-5 of FIG. 4, and the cross-sectional positions of FIGS. 7, 9, 11, and 13 are the same as that of FIG. 5.

DETAILED DESCRIPTION

Figure 1:
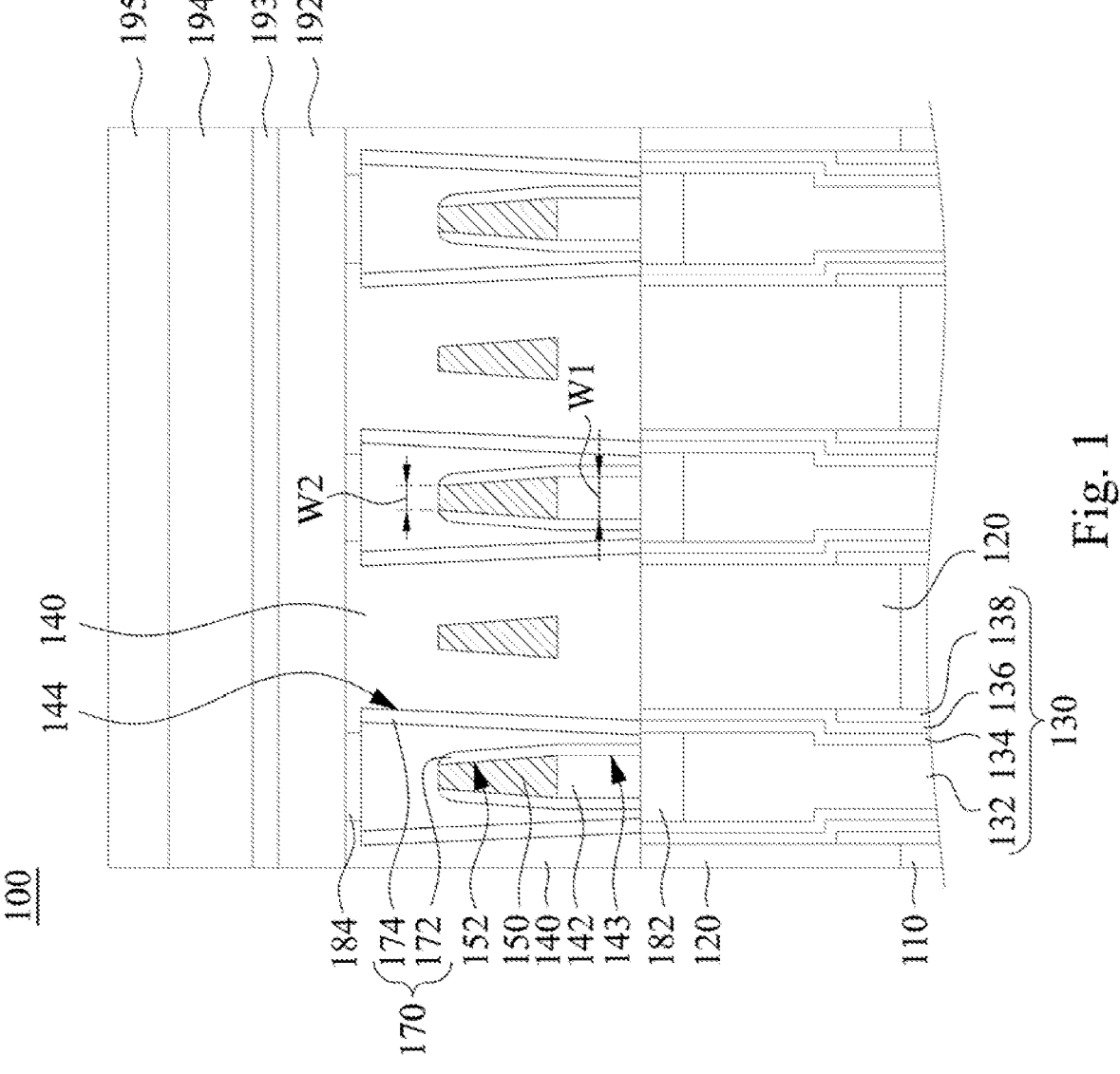
FIG. 1 is a cross-sectional view of a semiconductor structure according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a cross-sectional view of a semiconductor structure 100 according to some embodiments of the present disclosure. As shown in FIG. 1, the semiconductor structure 100 includes a first dielectric layer 110, a second dielectric layer 120, a capacitor structure 130, a third dielectric layer 140, a word line 150, a channel structure 160, and a gate dielectric 170. The second dielectric layer 120 is located on the first dielectric layer 110. In some embodiments, the first dielectric layer 110 and the second dielectric layer 120 include different materials. For example, the material of the first dielectric layer 110 may be oxide, and the material of the second dielectric layer 120 may be nitride. The capacitor structure 130 is located in the first dielectric layer 110 and the second dielectric layer 120. The third dielectric layer 140 is located on the second dielectric layer 120, and the material of the third dielectric layer 140 may be oxide. The third dielectric layer 140 may include plural oxide layers respectively below, surrounding, and over the word line 150. The word line 150 is located in the third dielectric layer 140, wherein a portion 142 of the third dielectric layer 140 is between the word line 150 and the capacitor structure 130. In some embodiments, the material of the word line 150 may be tungsten, but the present disclosure is not limited in this regard. The word line 150 may be aligned with the capacitor structure 130.

The channel structure 160 is located in the third dielectric layer 140 and surrounds the word line 150 and said portion 142 of the third dielectric layer 140. The material of the channel structure 160 may be, but not limited to indium gallium zinc oxide (IGZO). In addition, the gate dielectric 170 has a first portion 172 and a second portion 174 that is separated from the first portion 172. The first portion 172 of the gate dielectric 170 is between a sidewall 152 of the word line 150 and the channel structure 160, and the second portion 174 of the gate dielectric 170 is between an inner sidewall 144 of the third dielectric layer 140 and the channel structure 160.

In some embodiments, the semiconductor structure 100 can be referred to as a dynamic random access memory (DRAM), and includes a memory vertical transistor and a DRAM capacitor (i.e., the capacitor structure 130). Moreover, the word line 150 can act as a gate metal to perform gate control, while the channel structure 160 can serve as the channel of the transistor.

Specifically, since the portion 142 of the third dielectric layer 140 is between the word line 150 and the capacitor structure 130, and the channel structure 160 surrounding the word line 150 and the portion 142 of the third dielectric layer 140 can act as the channel of the transistor, gate control of the semiconductor structure 100 can be achieved by the outer sidewalls 152 of the word line 150. As a result of such a configuration, the semiconductor structure 100 having the word line 150 and the channel structure 160 can overcome the problems of CD (Critical dimension) vibration and OVL (Overlay) shift about a traditional design associated with a word line surrounding and a channel, thereby improving capability of gate control.

In some embodiments, a width W1 of the bottom of the word line 150 is greater than a width W2 of the top of the word line 150. The width W2 of the word line 150 may be in a range from 10 nm to 12 nm. The top of the word line 150 is in contact with the channel structure 160. Furthermore, the first portion 172 of the gate dielectric 170 extends to a sidewall 143 of the portion 142 of the third dielectric layer 140. The channel structure 160 is surrounded by the second portion 174 of the gate dielectric 170.

Moreover, the capacitor structure 130 includes a semiconductor material 132, a first electrode 134, a high-k dielectric 136, and a second electrode 138. The first electrode 134 surrounds the semiconductor material 132. The high-k dielectric 162 surrounds the first electrode 134. The second electrode 138 surrounds the bottom portion of the high-k dielectric 136. The high-k dielectric 162 is located between the first electrode 134 and the second electrode 138 so as to form a metal-insulator-metal (MIM) structure. The first electrode 134 and the second electrode 138 may serve as an upper electrode and a lower electrode, respectively. The semiconductor material 132 may be polysilicon, but the present disclosure is not limited in this regard.

In some embodiments, the semiconductor structure 100 further includes a source region 182 and a drain region 184. The source region 182 is located between the top of the capacitor structure 130 and the bottom of the portion 142 of the third dielectric layer 140. The drain region 184 is located on the top of the channel structure 160. In some embodiments, the bottom of the first portion 172 and the bottom of the second portion 174 of the gate dielectric 170 may be in contact with the source region 182. In addition, the bottom of the channel structure 160 may be in contact with the source region 182.

The semiconductor structure 100 further includes a bit line 192, a barrier layer 193, a fourth dielectric layer 194, and a fifth dielectric layer 195. The bit line 192 is electrically connected to the drain region 184. The fourth dielectric layer 194 is located on the bit line 192. The fifth dielectric layer 195 is located on the fourth dielectric layer 194, wherein the material of the fifth dielectric layer 195 is different from the material of the fourth dielectric layer 194. For example, the material of the fourth dielectric layer 194 may be oxide, while the material of the fifth dielectric layer 195 may be nitride.

It is to be noted that the connection relationships, the materials, and the advantages of the elements described above will not be repeated in the following description. In the following description, another semiconductor structure will be explained.

Figure 2:
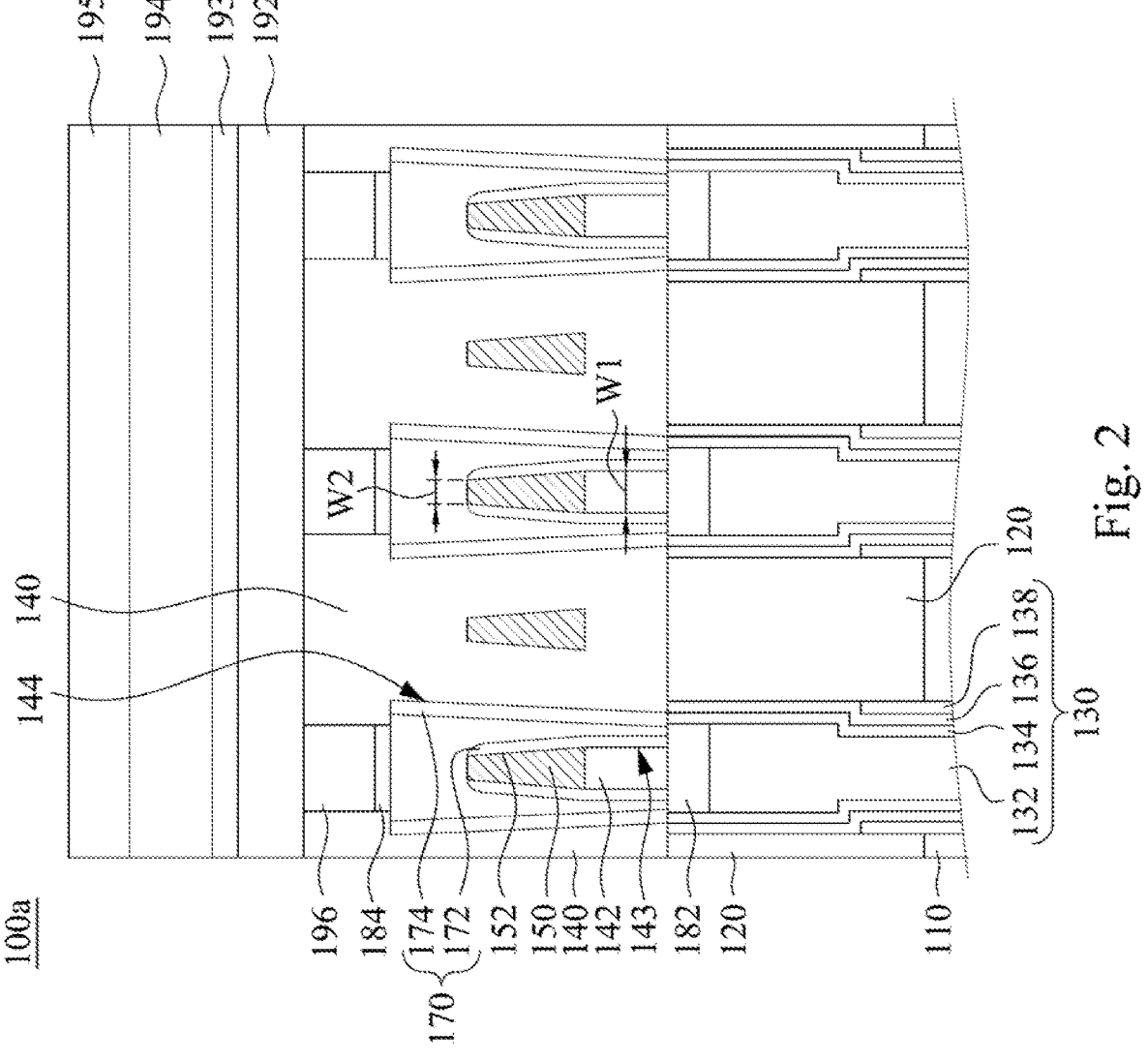
FIG. 2 is cross-sectional view of a semiconductor structure according to some embodiments of the present disclosure.

FIG. 2 is cross-sectional view of a semiconductor structure 100a according to some embodiments of the present disclosure. The semiconductor structure 100a includes the first dielectric layer 110, the second dielectric layer 120, the capacitor structure 130, the third dielectric layer 140, the word line 150, the channel structure 160, and the gate dielectric 170. The difference between this embodiment and the embodiment of FIG. 1 is that the semiconductor structure 100a further includes a landing pad 196 that is between the drain region 184 and the bit line 192. In such a configuration, the bit line 192 is electrically connected to the drain region 184 through the landing pad 196.

FIG. 3 is a flow chart of a manufacturing method of a semiconductor structure according to some embodiments of the present disclosure. The manufacturing method of the semiconductor structure includes the following steps. In step S1, a capacitor structure is formed in a first dielectric layer and a second dielectric layer that is located on the first dielectric layer. Thereafter, in step S2, a third dielectric layer and a word line are formed on the second dielectric layer, wherein the word line is located in the third dielectric layer and extends across the capacitor structure, wherein a portion of the third dielectric layer is between the word line and the capacitor structure. Next, in step S3, a channel hole is formed in the third dielectric layer to expose the word line. Afterwards, in step S4, a first portion and a second portion of a gate dielectric are respectively formed on a sidewall of the word line and an inner sidewall of the third dielectric layer. Subsequently, in step S5, a channel structure is formed in the channel hole of the third dielectric layer, wherein the channel structure surrounds the word line and said portion of the third dielectric layer. The manufacturing method of the semiconductor structure is not limited to the above steps S1 to S5. In some embodiments, the manufacturing method of the semiconductor structure may further include other steps between two of the above steps, before step S1, and after step S5. Moreover, steps S1 to S5 may each include multiple detailed steps. In the following description, at least the aforementioned steps S1 to S5 will be explained.

FIGS. 4, 6, 8, 10, 12, and 14 are top views at intermediate stages of the manufacturing method of the semiconductor structure 100a (see FIG. 1) according to some embodiments of the present disclosure. FIGS. 5, 7, 9, 11, and 13 are cross-sectional views at intermediate stages of the manufacturing method of the semiconductor structure 100a, in which FIG. 5 is a cross-sectional view taken along line 5-5 of FIG. 4, and the cross-sectional positions of FIGS. 7, 9, 11, and 13 are the same as that of FIG. 5.

Figure 4:
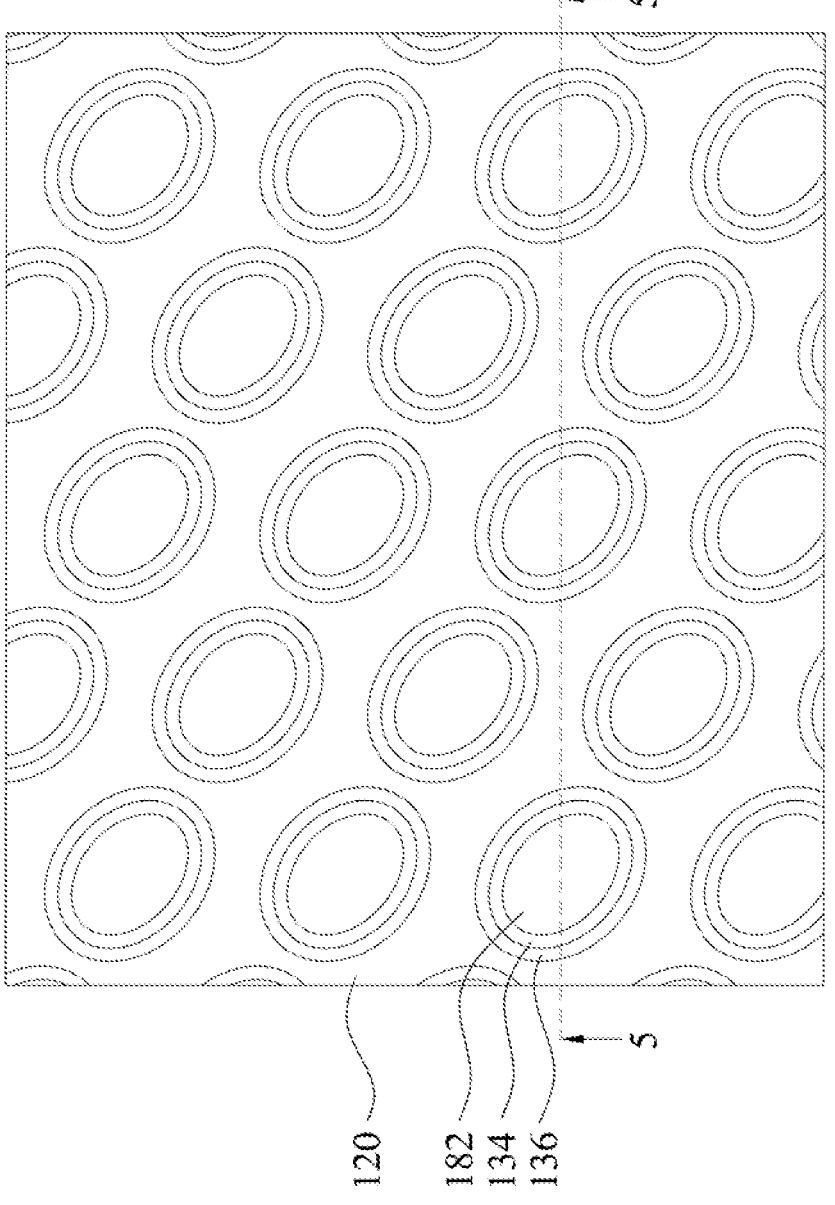
FIGS. 4, 6, 8, 10, 12, and 14 are top views at intermediate stages of the manufacturing method of the semiconductor structure according to some embodiments of the present disclosure.
Figure 5:
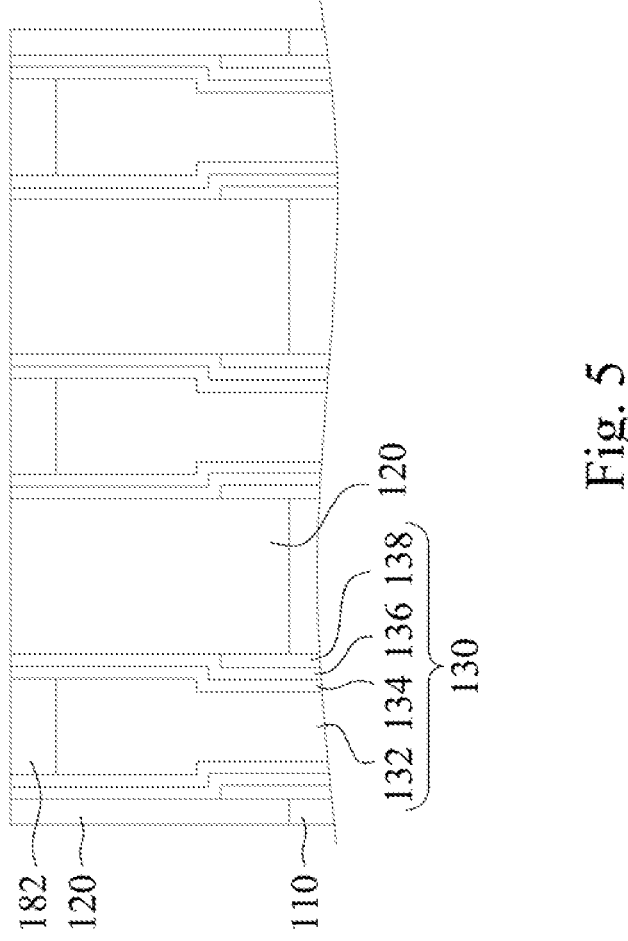

As shown in FIG. 4 and FIG. 5, the capacitor structure 130 is formed in the first dielectric layer 110 and the second dielectric layer 120 that is located on the first dielectric layer 110. The formation of the capacitor structure 130 may include the following steps. An opening may be formed in the stacked first and second dielectric layers 110 and 120, and then the second electrode 138 and the high-k dielectric 136 are sequentially formed on the sidewall of the opening. Thereafter, the first electrode 134 is formed on the high-k dielectric 136 such that the lower portion of the high-k dielectric 136 is between the first electrode 134 and the second electrode 138. Next, the opening is filled with the semiconductor material 132, and the source region 182 may be formed on the top of the semiconductor material 132 by epitaxial growth, thereby obtaining the capacitor structure 130.

Figure 6:
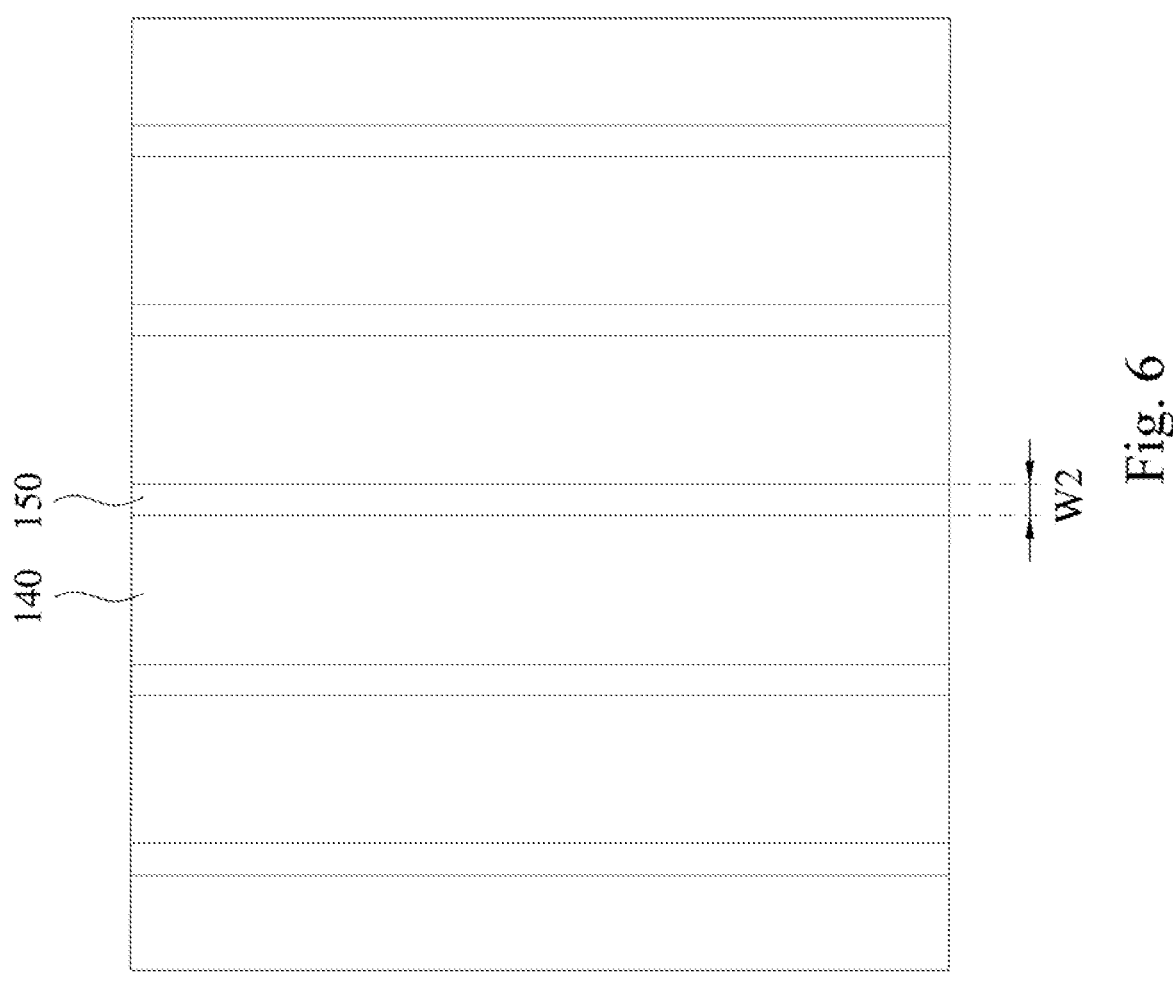
Figure 7:
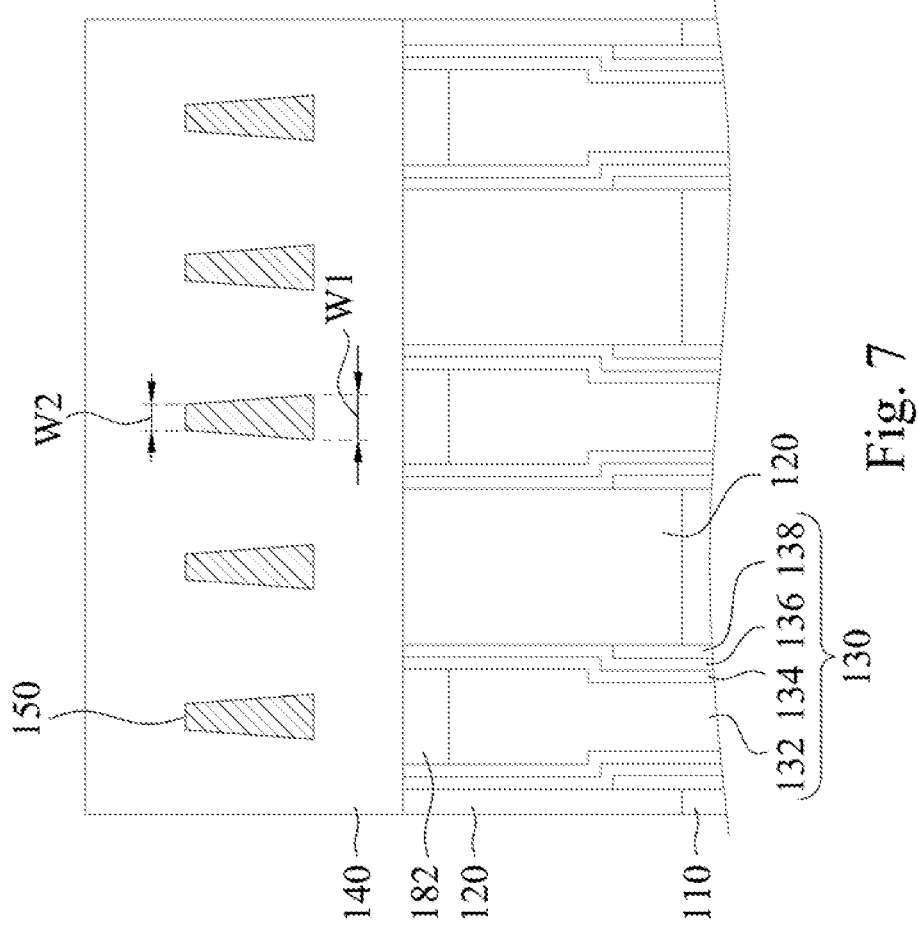

As shown in FIG. 6 and FIG. 7, after the formation of the capacitor structure 130, the third dielectric layer 140 and the word line 150 are formed on the second dielectric layer 120, wherein the word line 150 is located in the third dielectric layer 140 and extends across the capacitor structure 130, and a portion of the third dielectric layer 140 is between the word line 150 and the capacitor structure 130. The formation of the third dielectric layer 140 and the word line 150 may include forming a first layer of the third dielectric layer 140 covering the second dielectric layer 120 and the source region 182, forming a trench in the first layer of the third dielectric layer 140, forming the word line 150 in the trench, and forming a second layer of the third dielectric layer 140 covering the word line 150 and the first layer of the third dielectric layer 140. Compared with a traditional design, the critical dimension (CD) size for forming the word line 150 is shrunk. In some embodiments, forming the third dielectric layer 140 and the word line 150 on the second dielectric layer 120 is performed such that the word line 150 has the width W2 in the range from 10 nm to 12 nm, and the width W1 of the bottom of the word line 150 is greater than the width W1 of the top of the word line 150.

Figure 8:
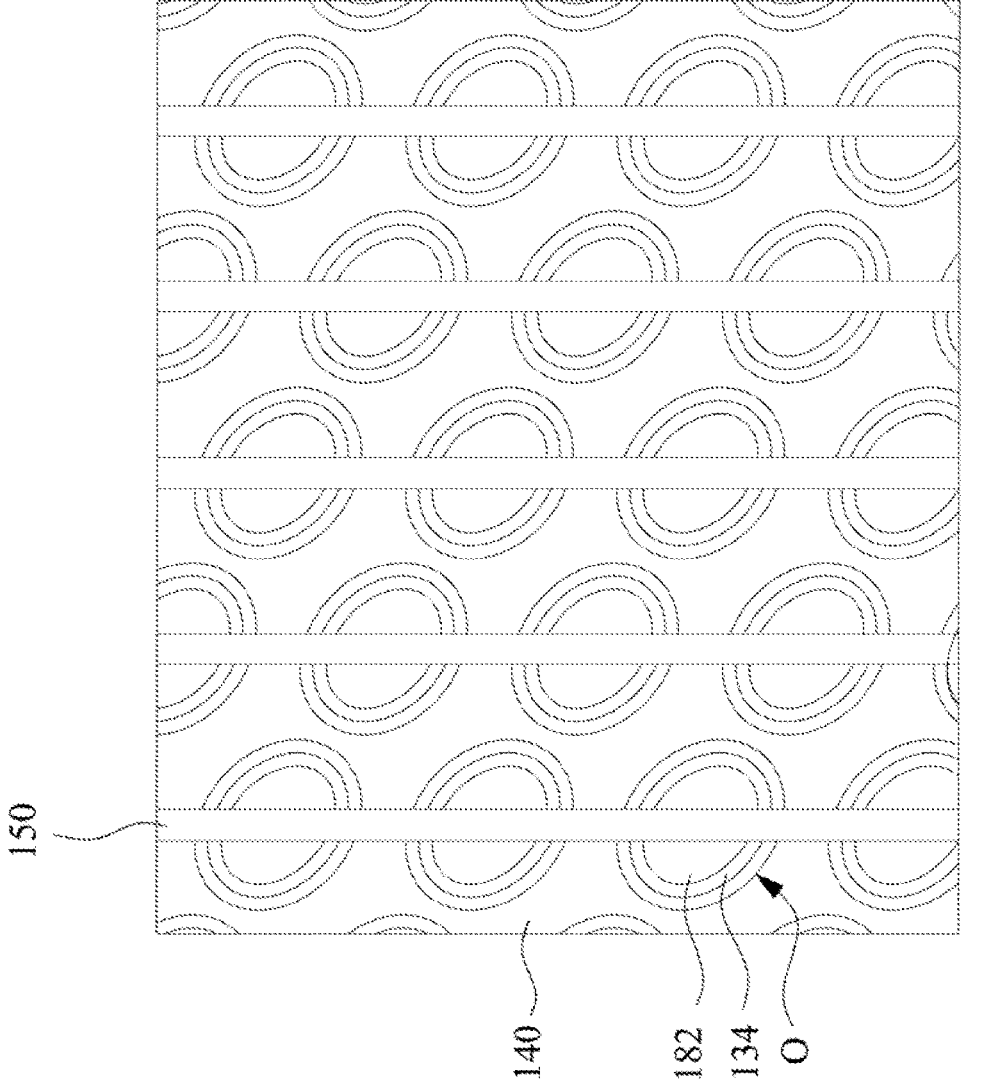
Figure 9:
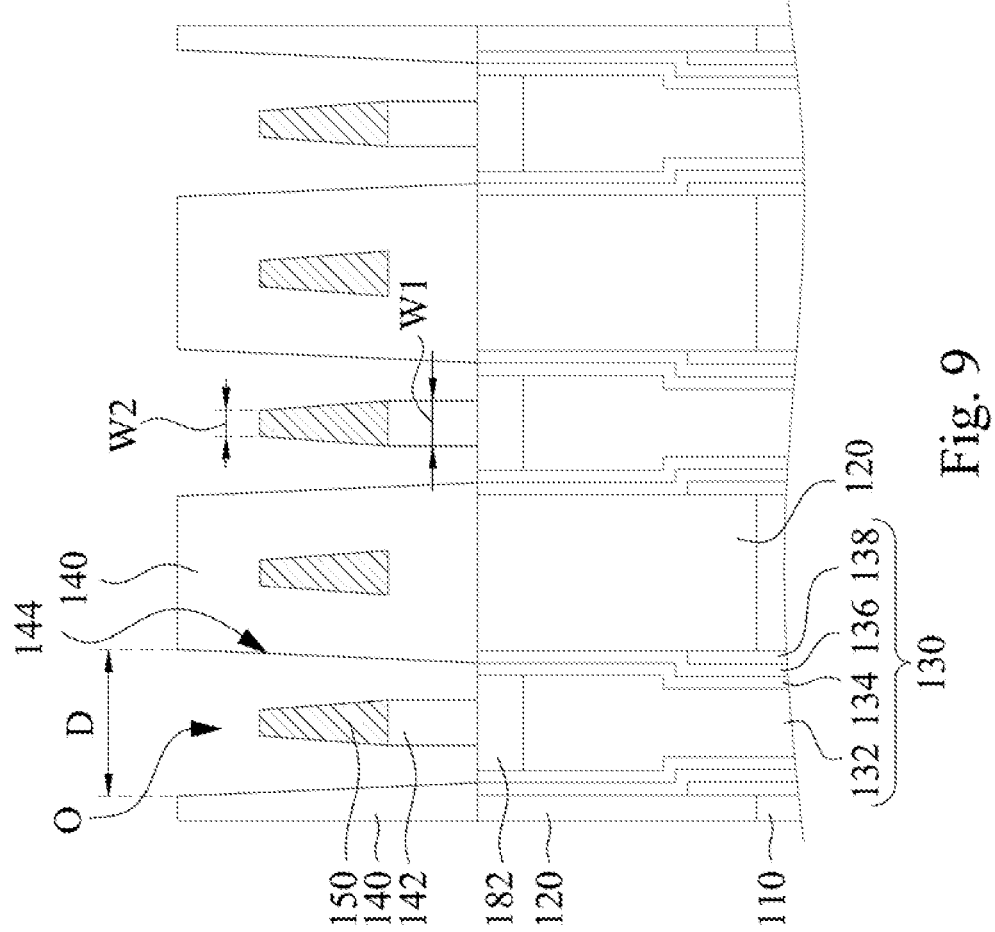

As shown in FIG. 8 and FIG. 9, after the formation of the word line 150 and the third dielectric layer 140, a channel hole O is formed in the third dielectric layer 130 to expose the word line 150. Compared with a traditional design, the critical dimension (CD) size for forming the channel hole O and the subsequent channel structure 160 (see FIG. 11) is enlarged. In some embodiments, the channel hole O has a diameter D is in a range from 40 nm to 44 nm, such as 42 nm. Moreover, forming the channel hole O in the third dielectric layer 140 includes etching the third dielectric layer 140 by using an enchant having a high etch selectivity between the third dielectric layer 140 and the word line 150, thereby preventing the word line 150 (i.e., gate metal) from being damaged.

Figure 10:
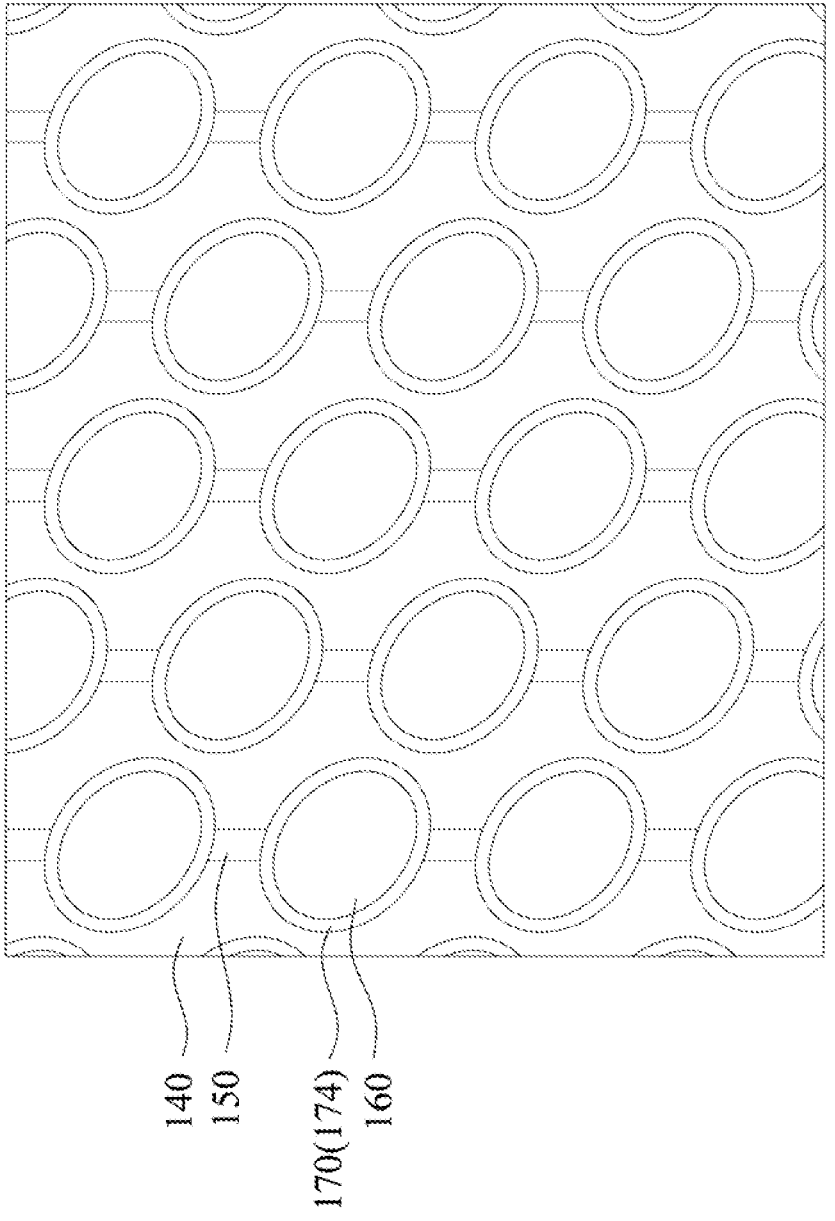
Figure 11:
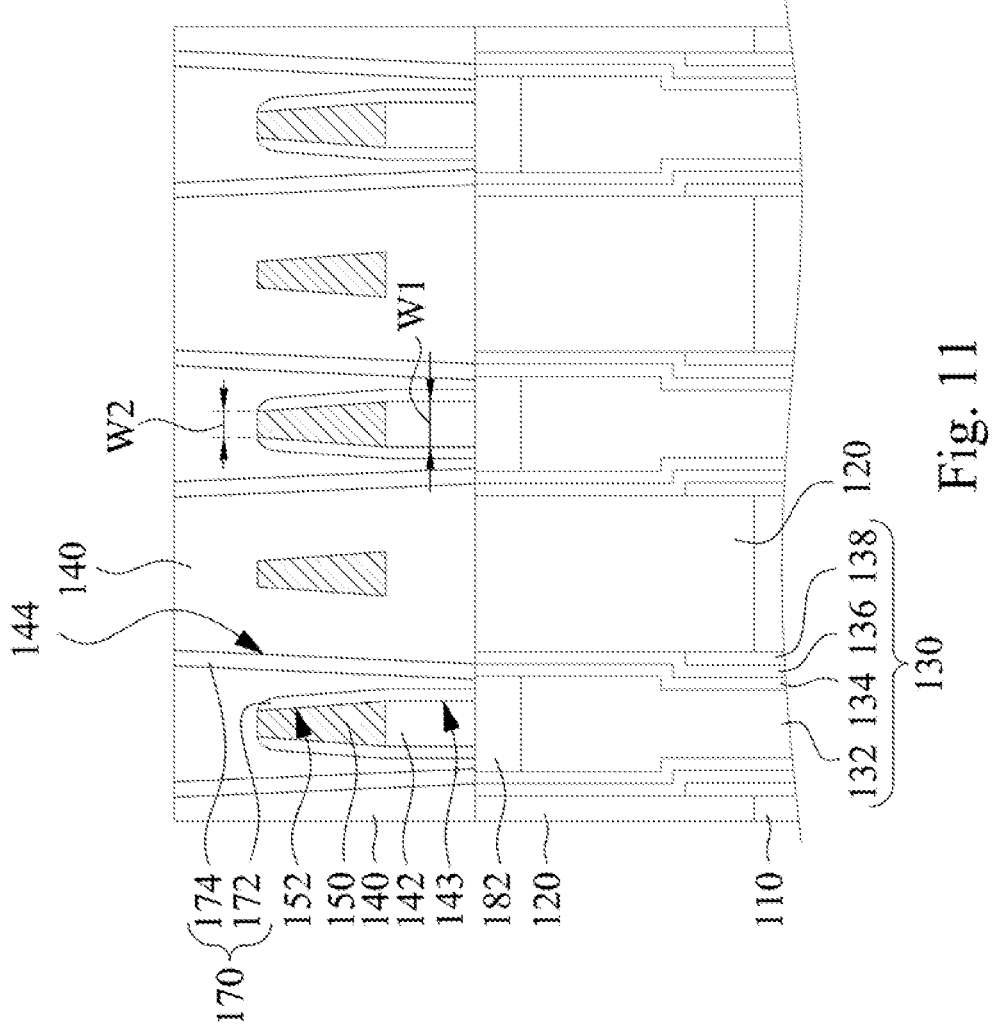

As shown in FIG. 10 and FIG. 11, thereafter, the first portion 172 and the second portion 174 of the gate dielectric 170 are respectively formed on the sidewall 152 of the word line 150 and the inner sidewall 144 of the third dielectric layer 140. The gate dielectric 170 may be formed by depositing and patterning. Furthermore, forming the first portion 172 and the second portion 174 of the gate dielectric 170 is performed such that the first portion 172 of the gate dielectric 170 extends to the sidewall 143 of the portion 142 of the third dielectric layer 140.

Subsequently, the channel structure 160 is formed in the channel hole O of the third dielectric layer 104, such that the channel structure 160 can surround the word line 150 and the portion 142 of the third dielectric layer 140. The diameter of the channel structure 160 may be similar to that of the channel hole O, such as in a range from 40 nm to 44 nm (e.g., 42 nm). Moreover, the first portion 172 of the gate dielectric 170 is between the word line 150 and the channel structure 160, and the second portion 174 of the gate dielectric 170 is between the channel structure 160 and the third dielectric layer 140.

Figure 12:
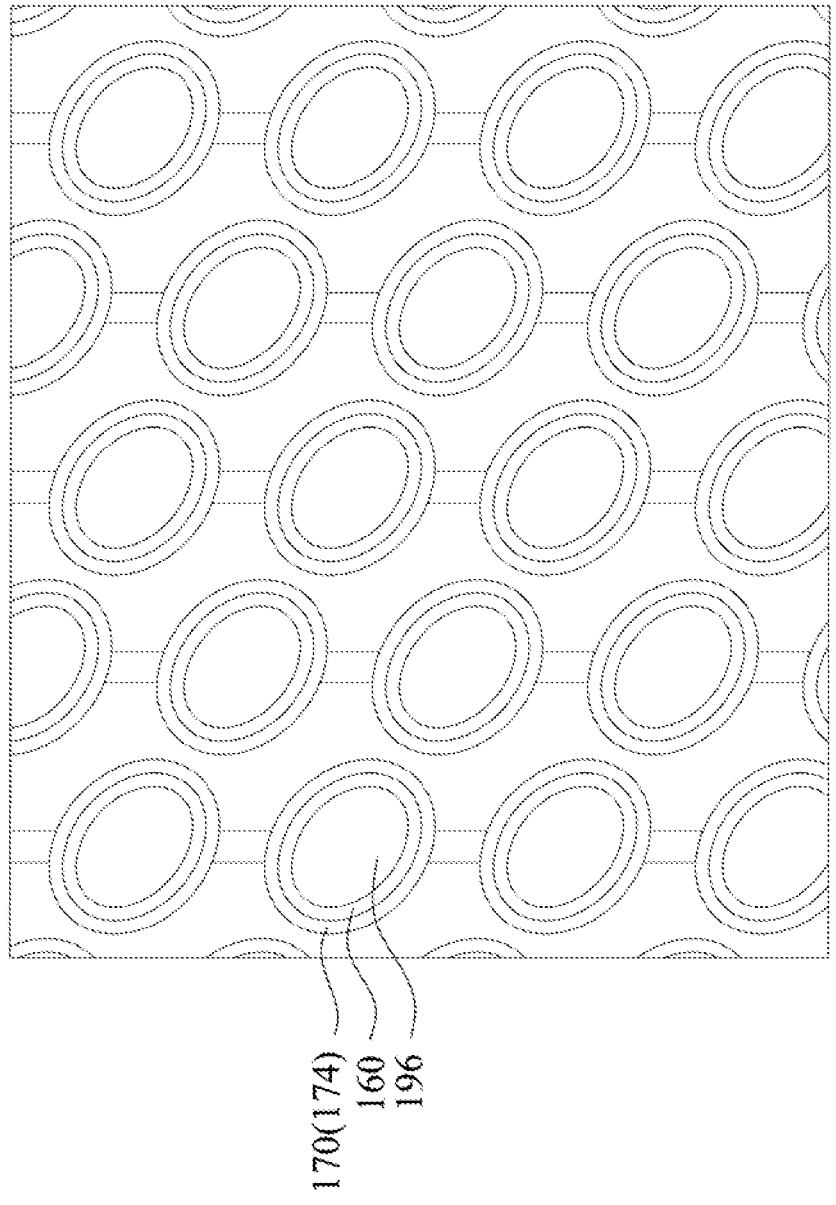
Figure 13:
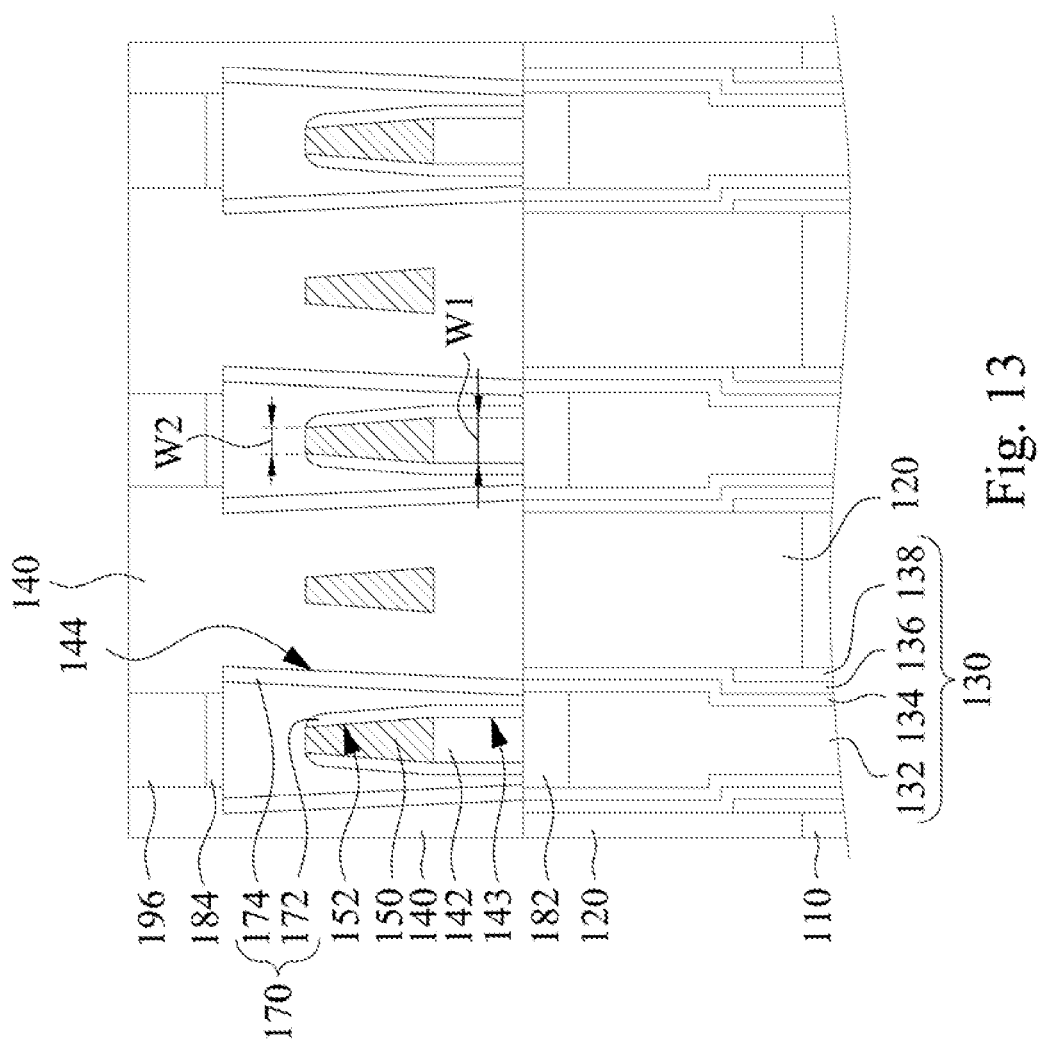

As shown in FIG. 12 and FIG. 13, after the channel hole O is filled with the channel structure 160, the drain region 184 may be formed on the top of the channel structure 160 by epitaxial growth. Afterwards, a third layer of the third dielectric layer 140 and the landing pad 196 are optionally formed on the second layer of the third dielectric layer 140 and the drain region 184. The landing pad 196 is aligned with and electrically connected to the drain region 184.

Figure 14:
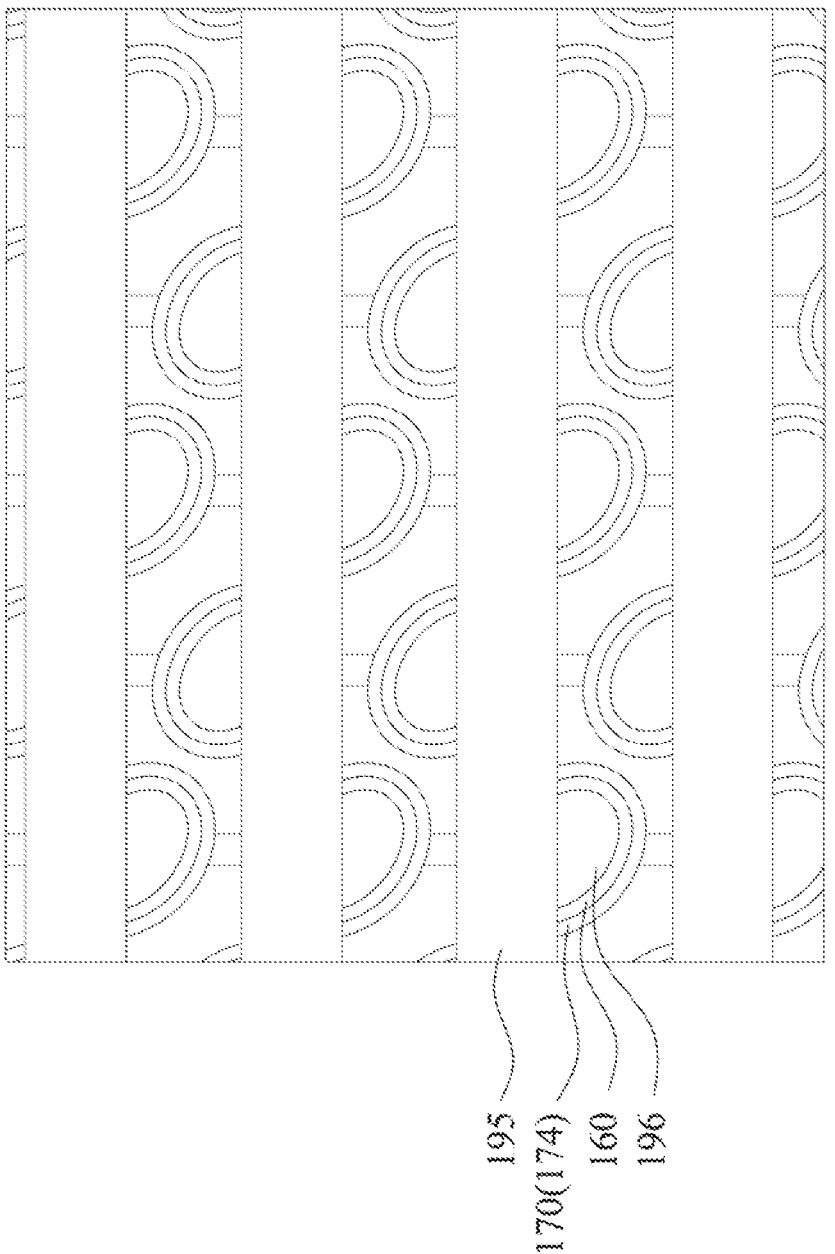

As shown in FIG. 14 and FIG. 2, after the formation of the third layer of the third dielectric layer 140 and the landing pad 196, the bit line 192, the barrier layer 193, the fourth dielectric layer 194, and the fifth dielectric layer 195 are sequentially formed on the third dielectric layer 140 and the landing pad 196, such that the landing pad 196 is located between the drain region 184 and the bit line 192, and the bit line 192 is electrically connected to the drain region 184 through the landing pad 196. As a result, the semiconductor structure 100*a* of FIG. 2 can be obtained.

As shown in FIG. 13 and FIG. 1, if the landing pad 196 is not formed, the bit line 192 may be directly formed on the drain region 184 and the third dielectric layer 140 without the landing pad 196. Thereafter, the barrier layer 193, the fourth dielectric layer 194, and the fifth dielectric layer 195 are sequentially formed on the bit line 192. As a result, the semiconductor structure 100 of FIG. 1 can be obtained.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   a first dielectric layer;
   a second dielectric layer located on the first dielectric layer;
   a capacitor structure located in the first dielectric layer and the second dielectric layer, and comprising a semiconductor material;
   a third dielectric layer located on the second dielectric layer;
   a word line located in the third dielectric layer and extending across the capacitor structure, wherein a portion of the third dielectric layer is between the word line and the capacitor structure, and said portion of the third dielectric layer, the word line, and the capacitor structure are aligned with each other;
   a channel structure located in the third dielectric layer and surrounding the word line and said portion of the third dielectric layer;
   a source region between a top of the capacitor structure and a bottom of said portion of the third dielectric layer, wherein a top of said portion of the third dielectric layer and the bottom of said portion of the third dielectric layer are respectively in direct contact with a bottom of the word line and a top of the source region, and an orthogonal projection of the entire said portion of the third dielectric layer and an orthogonal projection of the entire word line on the top of the capacitor structure completely overlap with each other and are only located on the semiconductor material of the capacitor structure; and
   a gate dielectric having a first portion and a second portion separated from the first portion, wherein the first portion is between a sidewall of the word line and the channel structure, and the second portion is between an inner sidewall of the third dielectric layer and the channel structure.

2. The semiconductor structure of claim 1, wherein the first portion of the gate dielectric extends to a sidewall of said portion of the third dielectric layer.

3. The semiconductor structure of claim 1, wherein a bottom of the first portion of the gate dielectric is in contact with the source region.

4. The semiconductor structure of claim 1, wherein a bottom of the second portion of the gate dielectric is in contact with the source region.

5. The semiconductor structure of claim 1, wherein a bottom of the channel structure is in contact with the source region.

6. The semiconductor structure of claim 1, wherein the channel structure is surrounded by the second portion of the gate dielectric.

7. The semiconductor structure of claim 1, wherein the capacitor structure further comprises:
   a first electrode surrounding the semiconductor material;
   a high-k dielectric surrounding the first electrode; and
   a second electrode surrounding a bottom portion of the high-k dielectric.

8. The semiconductor structure of claim 1, further comprising:
   a drain region located on a top of the channel structure.

9. The semiconductor structure of claim 8, further comprising:

a bit line electrically connected to the drain region.

10. The semiconductor structure of claim 9, further comprising:

a landing pad between the drain region and the bit line.

11. The semiconductor structure of claim 9, further comprising:

a fourth dielectric layer located on the bit line; and a fifth dielectric layer located on the fourth dielectric layer, wherein a material of the fifth dielectric layer is different from a material of the fourth dielectric layer.

12. The semiconductor structure of claim 1, wherein a width of the bottom of the word line is greater than a width of a top of the word line.

13. The semiconductor structure of claim 12, wherein the top of the word line is in contact with the channel structure.

14. A manufacturing method of a semiconductor structure, comprising:

forming a capacitor structure in a first dielectric layer and a second dielectric layer that is located on the first dielectric layer, wherein the capacitor structure comprises a semiconductor material;

forming a source region on a top of the capacitor structure;

forming a third dielectric layer and a word line on the second dielectric layer, wherein the word line is located in the third dielectric layer and extends across the capacitor structure, wherein a portion of the third dielectric layer is between the word line and the capacitor structure;

forming a channel hole in the third dielectric layer to expose the word line, wherein said portion of the third dielectric layer, the word line, and the capacitor structure are aligned with each other, and the source region is between the top of the capacitor structure and a bottom of said portion of the third dielectric layer, and a top of said portion of the third dielectric layer and the bottom of said portion of the third dielectric layer are respectively in direct contact with the a bottom of the word line and a top of the source region, and an orthogonal projection of the entire said portion of the third dielectric layer and an orthogonal projection of the entire word line on the top of the capacitor structure completely overlap with each other and are only located on the semiconductor material of the capacitor structure;

forming a first portion and a second portion of a gate dielectric respectively on a sidewall of the word line and an inner sidewall of the third dielectric layer; and forming a channel structure in the channel hole of the third dielectric layer, wherein the channel structure surrounds the word line and said portion of the third dielectric layer.

15. The manufacturing method of the semiconductor structure of claim 14, wherein forming the third dielectric layer and the word line on the second dielectric layer is performed such that a width of the bottom of the word line is greater than a width of a top of the word line.

16. The manufacturing method of the semiconductor structure of claim 14, wherein forming the first portion and the second portion of the gate dielectric is performed such that the first portion of the gate dielectric extends to a sidewall of said portion of the third dielectric layer.

17. The manufacturing method of the semiconductor structure of claim 14, wherein forming the channel hole in the third dielectric layer comprises etching the third dielectric layer by using an enchant having a high etch selectivity between the third dielectric layer and the word line.

18. The manufacturing method of the semiconductor structure of claim 14, wherein forming the third dielectric layer and the word line on the second dielectric layer is performed such that the word line has a width in a range from 10 nm to 12 nm.

19. The manufacturing method of the semiconductor structure of claim 14, wherein forming the channel hole in the third dielectric layer is performed such that the channel hole has a diameter is in a range from 40 nm to 44 nm.

* * * * *